(12) United States Patent (10) Patent No.: US 9,128,371 B2
Kurosawa (45) Date of Patent: Sep. 8, 2015

(54) IMPRINT METHOD, IMPRINT APPARATUS, AND ARTICLE MANUFACTURING METHOD

(75) Inventor: Hiroshi Kurosawa, Utsunomiya (JP)

(73) Assignee: CANON KABUSHIKI KAISHA (JP)

(*) Notice: Subject to any disclaimer, the term of this patent is extended or adjusted under 35 U.S.C. 154(b) by 0 days.

(21) Appl. No.: 13/478,287

(22) Filed: May 23, 2012

(65) Prior Publication Data

US 2012/0321797 A1 Dec. 20, 2012

(30) Foreign Application Priority Data

Jun. 16, 2011 (JP) ................................ 2011-134453

(51) Int. Cl.
*B29C 59/02* (2006.01)
*B05C 11/00* (2006.01)
*B05C 9/06* (2006.01)
*B05D 1/36* (2006.01)
*B05D 3/12* (2006.01)
*G03F 7/00* (2006.01)
*B82Y 10/00* (2011.01)
*B82Y 40/00* (2011.01)

(52) U.S. Cl.
CPC ............ *G03F 7/0002* (2013.01); *B82Y 10/00* (2013.01); *B82Y 40/00* (2013.01)

(58) Field of Classification Search
CPC ....... G03F 7/0002; B82Y 10/00; B82Y 40/00
USPC .......................................................... 427/355
See application file for complete search history.

(56) References Cited

U.S. PATENT DOCUMENTS

| 2007/0114696 A1* | 5/2007 | Miyakoshi ..................... 264/284 |
| 2009/0267267 A1* | 10/2009 | Yoneda et al. ................ 264/293 |
| 2009/0285073 A1* | 11/2009 | Takaishi et al. ............ 369/53.41 |
| 2010/0072647 A1 | 3/2010 | Tokue et al. |
| 2010/0078846 A1* | 4/2010 | Resnick et al. ............... 264/101 |

FOREIGN PATENT DOCUMENTS

JP 2009-266841 A 11/2009
JP 2010-069762 A 4/2010

* cited by examiner

*Primary Examiner* — Dah-Wei D Yuan
*Assistant Examiner* — Kristen A Dagenais
(74) *Attorney, Agent, or Firm* — Rossi, Kimms & McDowell LLP (57) ABSTRACT

An imprint method includes an inspection step of inspecting a substrate to obtain information of a foreign substance on the substrate; and a film forming step of forming a film covering the foreign substance, using the information of a foreign substance on the substrate, wherein the film forming step is performed before the contact step.

11 Claims, 11 Drawing Sheets

IMPRINT METHOD, IMPRINT APPARATUS, AND ARTICLE MANUFACTURING METHOD

BACKGROUND OF THE INVENTION

1. Field of the Invention

The present invention relates to an imprint method, imprint apparatus, and article manufacturing method.

2. Description of the Related Art

The imprint technique is a technique that makes transfer of nanoscale micropatterns possible, and is beginning to be put into practical use as one nanolithography technique for the mass-production of magnetic recording media and semiconductor devices. An apparatus such as an electron-beam exposure apparatus is used to form, on the mesa surface of a mold, patterns of a shot region to be transferred by the imprint technique. A mold having patterns formed by using an apparatus such as an electron-beam exposure apparatus is imprinted as an original on a substrate such as a silicon wafer or glass plate as a pattern transfer target, thereby transferring the patterns. These micropatterns are formed by coating the substrate with an imprinting resin (dispensing the resin on the substrate), and curing the resin while the patterns of the mold are pressed against the substrate with the resin being sandwiched between them.

Imprint techniques presently put into practical use are the heat cycle method and photo-curing method. In the heat cycle method, while the fluidity of a thermoplastic resin is increased by heating the resin to a temperature equal to or higher than the glass-transition temperature, a mold is pressed against a substrate with the resin being sandwiched between them. After the resin is cooled, patterns are formed on the resin by releasing the mold from the resin. On the other hand, the photo-curing method uses an ultraviolet-curing resin. While a mold made of a light-transmitting material such as quartz is pressed against a resin dispensed on the substrate, the resin is cured by ultraviolet irradiation, and patterns are formed on the cured resin by releasing the mold from the resin. In the heat cycle method, the transfer time increases due to temperature control, and the dimensional accuracy and positional accuracy decrease due to a temperature change. However, the photo-curing method has no such problems. Therefore, the photo-curing method is advantageous in the mass-production of nanoscale semiconductor devices.

Various imprint apparatuses have been implemented in accordance with resin curing methods and applications. As an apparatus for mass-producing semiconductor devices and the like, an apparatus using jet and flash imprint lithography (JFIL) is effective. An imprint apparatus fitted for JFIL is disclosed in Japanese Patent Laid-Open No. 2009-266841. This imprint apparatus includes a substrate stage, resin coating mechanism, imprint head, light irradiation system, and positioning alignment mark detecting mechanism. The apparatus uses a step-and-repeat method as in an exposure apparatus because the area of a shot region to be imprinted by one imprint operation is limited.

As an application of the imprint technique to semiconductors, a first possible application is to memory elements. The problem of memory elements is to reduce the cost by mass-production, and the most effect method of cost reduction is micropatterning. As is well known, the imprint technique is highly capable of micropatterning, and best suited to the need of memory elements. A defect of imprint processing is a high risk of decreasing the yield of semiconductor production. Examples of mold defects are a mold break caused by a particle adhered on a wafer, and clogging that occurs if a cured resin partially remains on a mold when the mold is released from the resin. These mold defects continuously cause transfer defects on following shot regions to be imprinted (repetitive defects). Accordingly, it is very important to analyze cases in which these mold defects occur, and remove the defects in accordance with the main causes. Japanese Patent Laid-Open No. 2009-266841 has proposed a method of coating a dummy wafer with a particle removing film having high adhesion to a light-curing resin, coating the particle removing film with a light-curing resin, and performing imprinting, thereby removing particles adhered to a mold by incorporating the particles into the light-curing resin. Also, Japanese Patent Laid-Open No. 2010-69762 has disclosed a method by which if a foreign substance that may break a mold is found on a wafer by inspecting the presence/absence of a foreign substance, imprint processing is performed on a shot region including the foreign substance by switching a mold to a dummy mold for which imprint processing can be performed.

Presently, however, even when a foreign substance such as a particle on a wafer can be found by an inspection apparatus beforehand, there is no method of removing the foreign substance. Therefore, it is necessary to perform imprint processing by using a dummy mold as disclosed in Japanese Patent Laid-Open No. 2010-69762, or perform no imprint processing on a shot region where the foreign substance exists. In the method using a dummy mold, it is difficult to form normally functioning circuit patterns, but the film thickness after imprinting is maintained. Accordingly, no adverse effect is given to surrounding shot regions during etching. However, it is necessary to use another mold support for holding the dummy mold, or switch the molds. This increases the apparatus cost or decreases the productivity. On the other hand, when no imprint processing is performed on a shot region where the foreign substance exists, an adverse effect may be given to shot regions normally imprinted in a subsequent etching process. Furthermore, neither methods can produce usable chips from shot regions imprinted by using the dummy mold, or from shot regions that are not imprinted. That is, no usable chip can be produced even from a chip region having no foreign substance problem, and this decreases the chip yield.

SUMMARY OF THE INVENTION

The present invention provides an imprint method that suppresses the decrease in throughput and yield even when a foreign substance exists on a substrate.

The present invention in its one aspect provides an imprint method comprising a dispensing step of dispensing a resin on a substrate, a contact step of bringing the dispensed resin into contact with a pattern surface of a mold, and a curing step of curing the resin in contact with the pattern surface, the method further comprising: an inspection step of inspecting the substrate to obtain information of a foreign substance on the substrate; and a film forming step of forming a film covering the foreign substance, using the information of a foreign substance on the substrate, wherein the film forming step is performed before the contact step.

Further features of the present invention will become apparent from the following description of exemplary embodiments with reference to the attached drawings.

DESCRIPTION OF THE EMBODIMENTS

An imprint method normally includes a coating step of coating (dispensing step of dispensing) a substrate with a resin, a contact step of bringing the coated resin in contact with the pattern surface of a mold, a curing step of curing the resin in contact with the pattern surface, and a releasing step of releasing the mold from the cured resin. The imprint method according to the present invention further includes an inspection step of inspecting the substrate and obtaining foreign substance information such as the presence/absence, size, and position of a foreign substance on the substrate, and a film forming step of forming a film covering the foreign substance when it is determined in the inspection step that a foreign substance exists. The imprint method of the present invention including the inspection step and film forming step will be explained in detail below in the first to fourth embodiments.

[First Embodiment]

Figure 1:
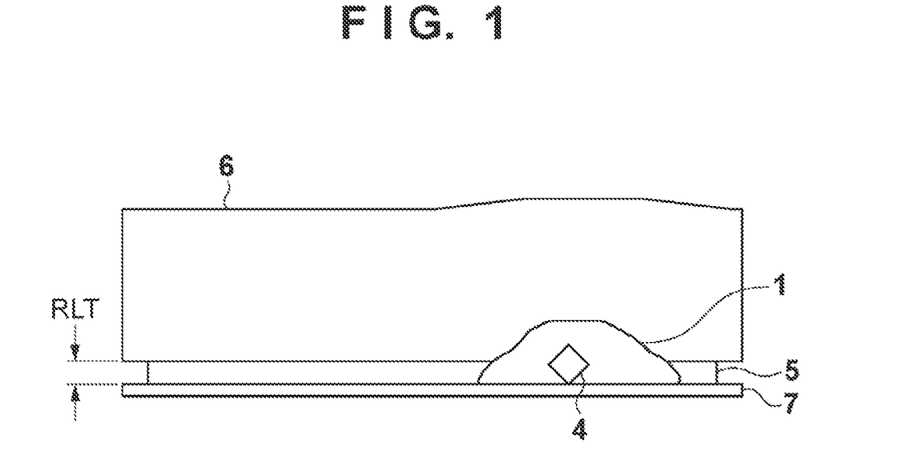
FIG. 1 is a view showing the way a film covering a foreign substance is formed in the first embodiment.
Figure 2:
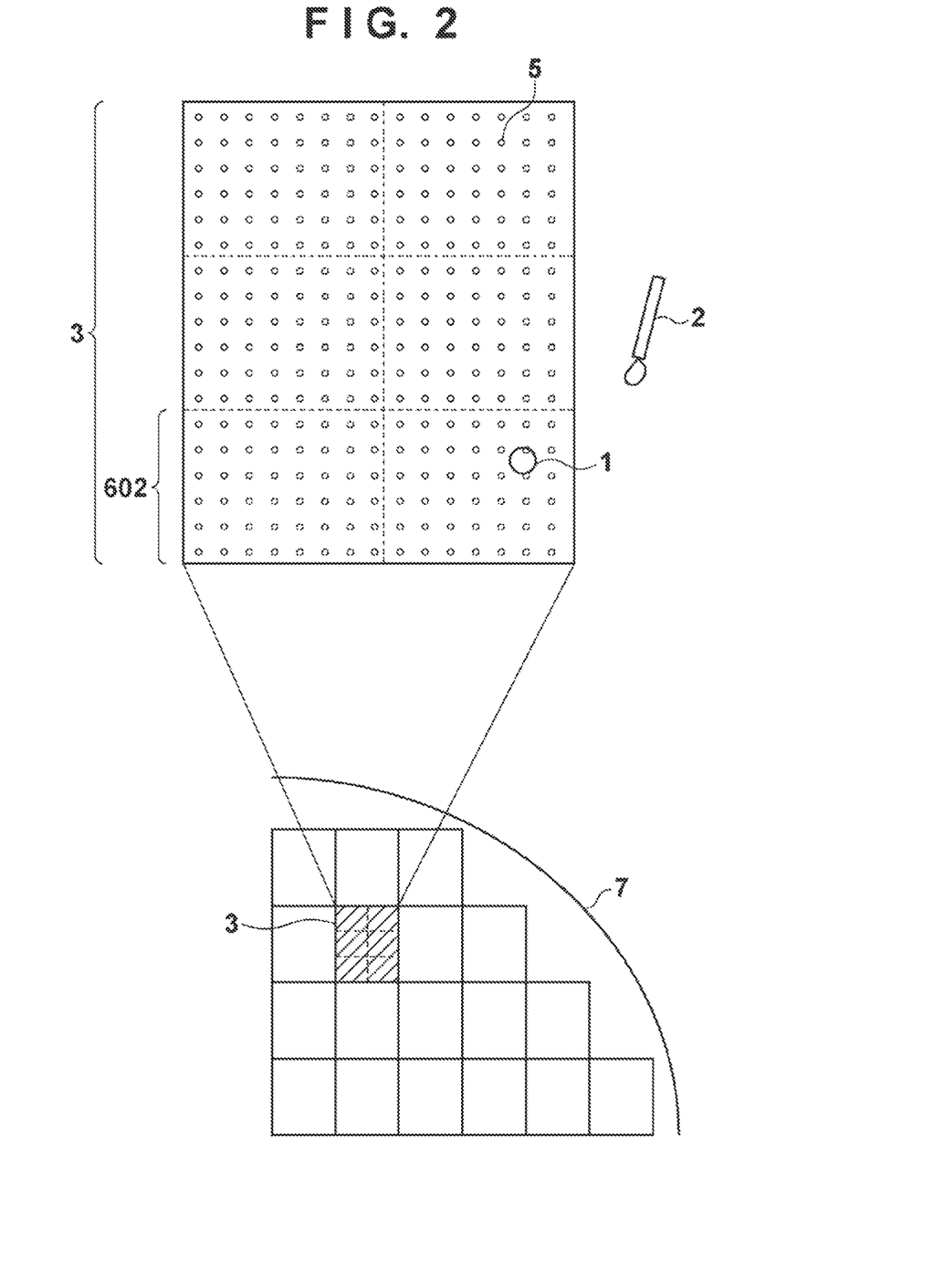
FIG. 2 is a view showing the way a film forming material is dropped on the position of the foreign substance.

The first embodiment is directed to a technique of mainly protecting a mold for semiconductor element imprint lithography. FIG. 1 is a conceptual view showing a method of protecting a mold 6 by forming a film covering a foreign substance 4 by using a high-viscosity material 1. The mold 6 is also called a mask, original, or template. The imprint method according to the first embodiment is based on the JFIL method touched upon in "BACKGROUND OF THE INVENTION". Application examples corresponding to other imprint schemes will be explained from the second embodiment. Patterns formed on the mesa (pattern surface) of the mold 6 are transferred onto a wafer (substrate) 7. As shown in FIG. 2, drops of an ultraviolet-curing resin (resist) 5 are dispensed from an inkjet dispenser beforehand on a shot region 3 as an imprint processing target of the wafer 7. The number of the drops of the resin 5 dispensed from the inkjet dispenser is generally a number pl. Efforts have been made to decrease the grain size of the resin 5 in order to shorten the filling time of the resin 5 during the imprint processing, that is, the time required for a gas to disappear from the resin 5 sandwiched between the wafer 7 and recesses of the pattern surface of the mold 6. The height of the drops of the resin 5 from the upper surface of the wafer 7 depends on the drop size, and is generally about 1 µm. In an imprint sequence, the pattern surface of the mold 6 is moved close to the shot region 3 on the wafer 7 coated with the resin 5 as shown in FIG. 2. When the drops of the resin 5 come in contact with the pattern surface of the mold 6, they spread in the X and Y directions (directions parallel to the pattern surface) of the shot region 3, and draw the pattern surface of the mold 6 by the capillary force. Consequently, balance is obtained while maintaining a gap (RLT) between the mold 6 and wafer 7, which corresponds to the volume of the dispensed resin like the resin 5 shown in FIG. 1. The value of RLT is determined by the line width of patterns formed on the wafer 7, and generally designed to be about a few ten nm. Although FIG. 1 does not illustrate the pattern surface of the mold 6, patterns of the mold 6 are actually formed on the pattern surface as the lower surface of the mold 6. The wafer 7 is transported to an imprint apparatus through many processes, and foreign substances 4 such as particles having various sizes sometimes adhere to a circuit formation surface during the processes. The foreign substance 4 shown in FIG. 1 is an example. When the mold 6 and wafer 7 are made to approach the above-described RLT width, the diameter of the foreign substance 4 adhered on the wafer 7 readily exceeds the RLT width. As a consequence, a contact operation (also called an imprint operation) of bringing the resin 5 and pattern surface into contact with each other may destroy the pattern surface of the mold 6. In the first embodiment, the high-viscosity material 1 that has a viscosity higher than that of the resin 5 and protects the mold 6 by forming a film covering the foreign substance 4 is dropped in the position of the foreign substance 4 before the imprint operation is performed, and the imprint operation is performed in this state.

The imprint operation requires a syringe (second coating device) 2 as a coating device for dispensing the high-viscosity material 1 as shown in FIG. 2, and an arrangement for obtaining the result of foreign substance inspection from a foreign substance inspection apparatus. In the imprint operation, a portion coated with the high-viscosity material 1 rises from the surface of the wafer 7, so a portion of the mold 6 which corresponds to the portion coated with the high-viscosity material 1 is slightly curved or recessed, but this portion returns to its original shape after UV exposure and mold release. That is, stress concentrates to a very small area of the pattern surface of the mold 6 and destroys the pattern surface because the foreign substance 4 exists. In the first embodiment, therefore, a buffer film is formed by dispensing the high-viscosity material 1 around the foreign substance 4. This makes it possible to protect the pattern surface of the mold 6 by relaxing the local concentration of the stress.

The light-curing resin 5 used for imprint lithography generally has a viscosity of 10 to 20 cP. This value is optimized by taking account of a viscosity necessary to maintain the jetting performance of the dispenser, and the fluidity for shortening the filling time when the mold 6 and resin 5 are brought into contact with each other. On the other hand, when performing jetting by using a syringe, the viscosity of the high-viscosity material 1 can be about 200 to 300 cP for a grain size of 0.2 µm. Also, when performing jetting by holding a syringe nozzle temperature higher than the ambient temperature, the viscosity after the material lands on the wafer can be held higher while decreasing the viscosity during jetting.

FIG. 2 shows the way the high-viscosity material 1 is dropped to cover the foreign substance 4. When performing imprinting by using the jet and flash imprint lithography (JFIL), a shot region is coated with the resin 5 by an inkjet dispenser immediately before imprinting. Assume that the foreign substance 4 exists in the shot region to be imprinted and the size and position of the foreign substance 4 are known. The syringe 2 drops the high-viscosity material 1 on the position where the foreign substance 4 exists. The high-viscosity material 1 need not be limited to a high-viscosity material as long as the material has the effect of relaxing the concentration of stress by the foreign substance 4 during the imprint operation. For example, it is also possible to make the dropping amount of the normal resin 5 around the foreign substance 4 larger than that in other regions. When jetting the high-viscosity material 1, it is necessary to selectively use the jetting profile of the inkjet module of the high-viscosity material 1 and that of the normal resin 5. Therefore, when the purpose and viscosity of the high-viscosity material 1 and the simplicity of the structure are taken into consideration, a simple jetting mechanism such as the syringe 2 is desirable. It is also possible to make the high-viscosity material 1 contain a fluorescent agent in order to confirm the presence/absence of the coating film of the high-viscosity material 1 on the wafer 7 by observation with a camera of an external apparatus. The foreign substance inspection apparatus inspects the wafers 7 one by one, and reports information pertaining to the presence/absence, height, position, and material of the foreign substance 4 to the imprint apparatus. The shot region 3 where the foreign substance 4 is detected is a target of the process of dropping the high-viscosity material 1. Also, as shown in FIG. 2, one shot region normally includes a plurality of (in the example shown in FIG. 2, six) chip regions 602, and good chips need be manufactured from all the chip regions 602 where no foreign substance 4 adheres, without damaging the mold 6.

Figure 4:
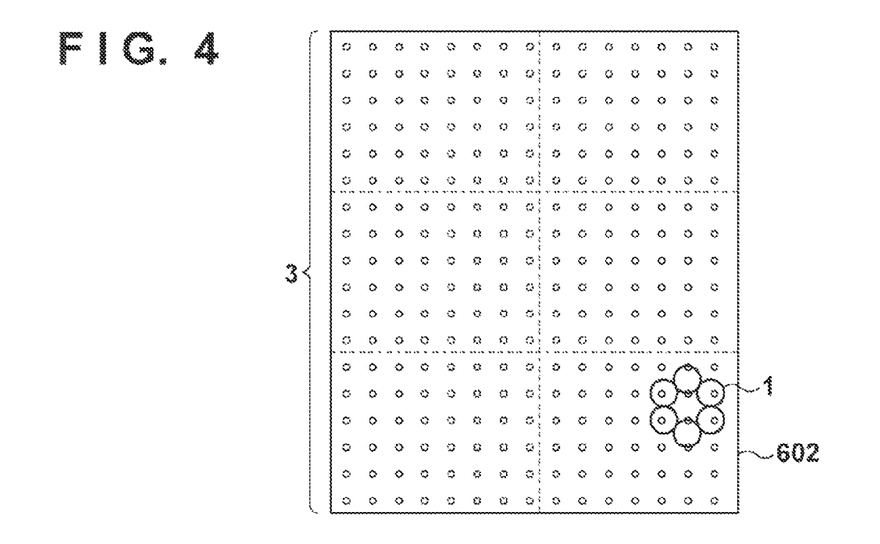
FIG. 4 is a view showing another way of dropping a film forming material on the position of the foreign substance.

FIG. 4 shows another mode in which the high-viscosity material 1 shown in FIG. 2 is dispensed. That is, a plurality of points around the foreign substance 4 are coated with the high-viscosity material 1, thereby increasing the area of the buffer film and reducing errors of landing positions in jetting of the high-viscosity material 1. This method increases the landing accuracy of the high-viscosity material 1. However, if the position of adhesion of the foreign substance 4 is close to the boundary of the chip region 602 or shot region 3, it is highly likely that the film made of the high-viscosity material 1 invades an adjacent chip region 602. In either case, the result of the imprint processing after the formation of the layer and the film formation information are additionally written in a lot processing result report for an online host or the like, because these result and information are the results of automatic processing performed on the wafer 7 by the imprint apparatus.

Figure 5:
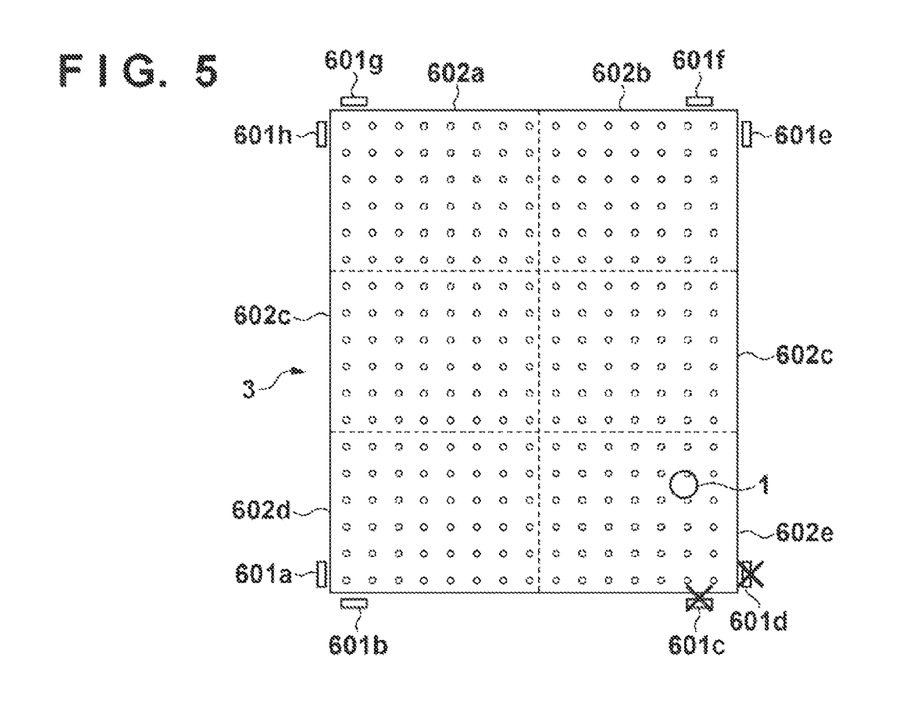
FIG. 5 is a view showing the relationship between alignment marks, chip regions, and a shot region.

FIG. 5 is a view in which alignment marks 601a to 601h for detecting the displacement between the shot region 3 and mold 6 by assuming die-by-die alignment are added to FIG. 2. In a chip region 602e including the region coated with the high-viscosity material 1, displacement may occur in the X and Y directions parallel to the pattern surface due to the rise of the mold 6 caused by the formation of the buffer film. Therefore, a controller C performs an imprint operation while positioning the wafer 7 so as to reduce the displacement between the mold 6 and wafer (substrate) 7 caused by the formation of the buffer film. Also, no good chip can be manufactured from the chip region 602e because the foreign substance 4 adheres. By taking account of these situations of the chip region 602e, the information of alignment marks around the chip region 602e is not referred to when performing shot region overlay correction calculations, or the weighting of correction amount calculations is narrowed. If the reproducibility of the profile of the mold 6 that rises by the high-viscosity material 1 is assured, it is possible to predict a displacement amount that may be produced in the shot region by calculations, and correct the measurement value of an alignment scope 9 or the control target value of die-by-die alignment. A shift error caused by the factor as described above must be taken into account in a method of determining an abnormal value of mark measurement results. Referring to FIG. 5, of the substrate-side marks 601a to 601h arranged around the shot region 3, the marks 601c and 602d near the chip region 602e are not used in the overlay correction process even when an alignment measurement value is obtained. That is, the controller C positions the wafer 7 based on the detection result of displacement between the substrate-side marks 601a, 601b, and 601e to 601h whose distances to the foreign substance 4 are equal to or larger than a predetermined value, among the plurality of substrate-side marks 601a to 601h, and mold-side marks corresponding to these substrate-side marks. As described above, the gist of FIG. 5 is that a partial shift amount of the mold 6 caused by the formation of the buffer film must be taken into consideration in the alignment correction logic, overlay correction amount, and abnormal value determination method when performing the imprint operation on the shot region 3.

Figure 6:
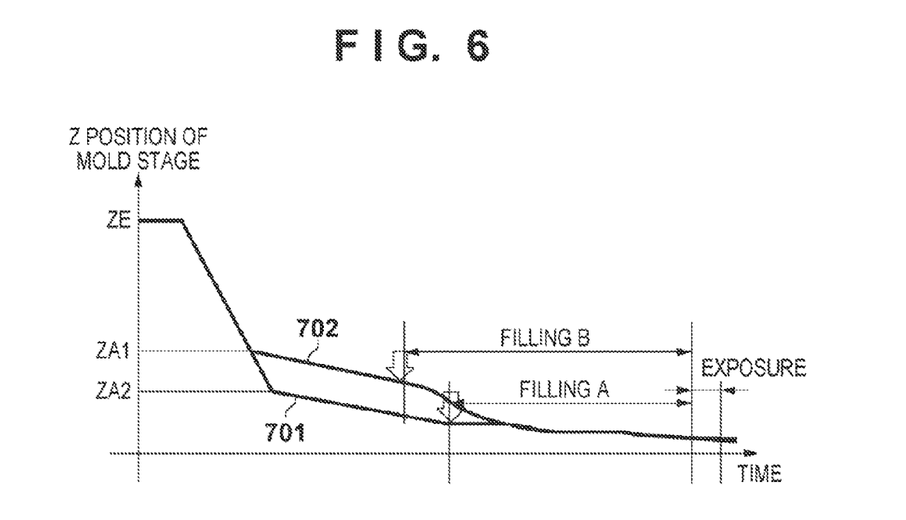
FIG. 6 is a view showing the driving profile of a mold stage in an imprint sequence.
Figure 8A:
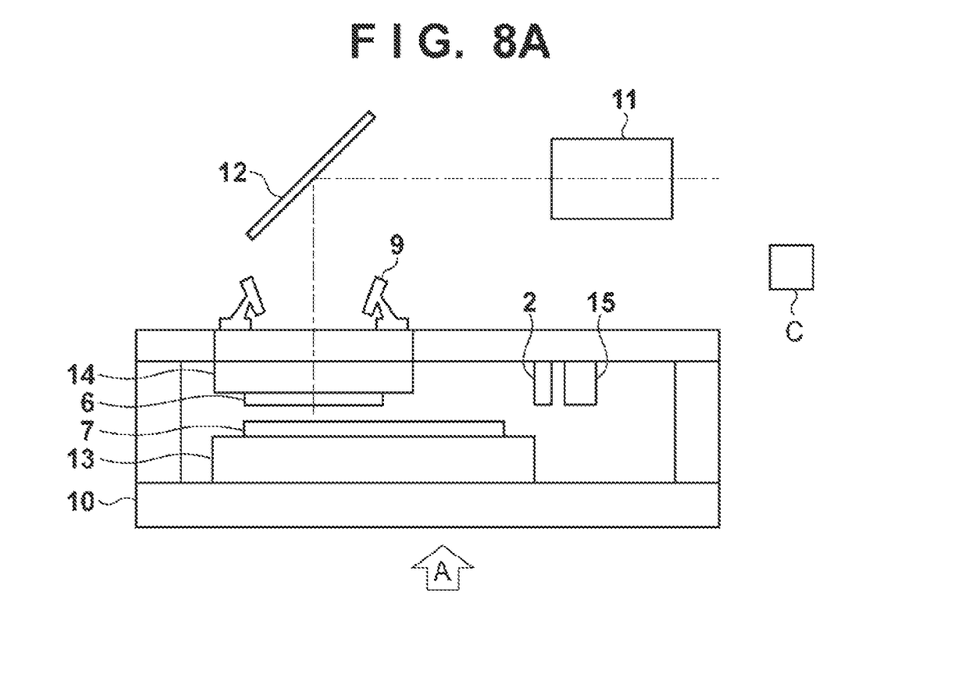
FIGS. 8A and 8B are views showing the imprint apparatus.
Figure 8B:
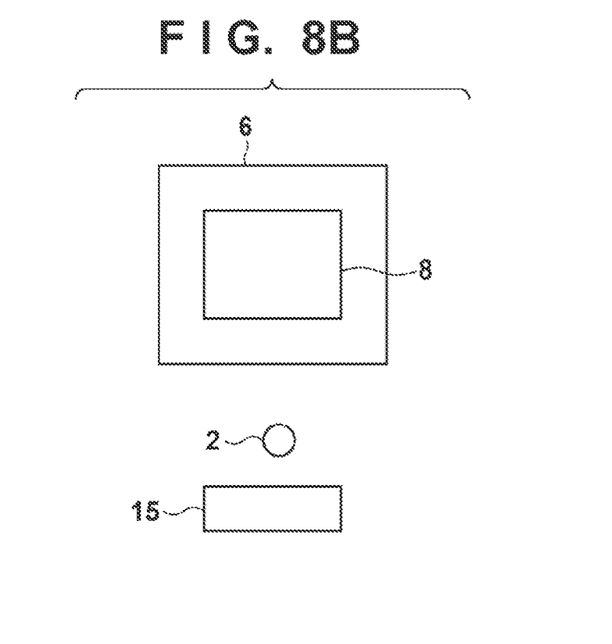

FIG. 6 is a graph showing the driving profile of the mold stage in the imprint sequence of the JFIL method. As shown in FIGS. 8A and 8B, the mold 6 is fixed to a mold chuck 14, and can be positioned in the Z direction perpendicular to the pattern surface and in leveling directions by the mold stage (not shown). In the imprint sequence, the Z position of the mold stage is controlled based on a driving profile in which the time elapsed from the start of imprinting is plotted on the abscissa shown in FIG. 6. A driving profile 701 is a driving profile when no foreign substance 4 exists on the wafer 7. The controller C of the imprint apparatus drives the mold stage toward the surface of the wafer 7 at a high speed (first speed) from a retracted position ZE of the mold stage (a first step). The controller C then moves the pattern surface of the mold 6 closer to the wafer 7 by decreasing the driving speed to a low speed (second speed) in a position ZA2 spaced apart in a non-contact direction by a slight amount from the surface of the wafer 7 (a second step). While the mold stage is driven by low-speed Z driving, the pattern surface of the mold 6 comes into contact with the surfaces of drops of the resin 5 dispensed on the surface of the wafer 7. A counter force generated by this contact can be detected by monitoring the current waveform of a linear motor or the like used in the mold stage. In an imprint filling sequence, the control mode is switched from a position control mode to a force control mode immediately after this counterforce is detected, and the mold 6 is pressed against the surface of the wafer 7 at a predetermined pressure (filling A). An imprint filling period (filling A) is a waiting time in which the drops of the resin 5 dispensed on the wafer 7 spread and gaps between the drops disappear. After this imprint filling period, the resin 5 is cured by ultraviolet irradiation from the non-pattern surface side of the mold 6 (exposure). After the exposure, the mold 6 is driven away from the wafer 7 and released from the pattern surface of the wafer 7, thereby completing the imprint sequence of one shot region. The foregoing is the sequence when no foreign substance 4 exists on the surface of the wafer 7.

It is, however, sometimes impossible to expectedly detect the foreign substance 4 existing on the wafer 7 due to marks or circuit patterns already written on the underlying substrate. Therefore, it is possible to implement a protecting function of monitoring the counterforce from the mold 6 immediately before the imprint operation is performed, that is, in an interval during which the mold stage is moved down from ZE to ZA2, and stopping driving in this interval if an unexpected counterforce is detected. To implement this protecting function, it is necessary to change the Z-driving sequence of the mold stage in accordance with the presence/absence of the foreign substance 4 on the wafer 7 (on the substrate). When the foreign substance 4 exists and the high-viscosity material 1 is dispensed, an end point ZA1 of the high-speed driving interval is set upward from the wafer 7 by an amount corresponding to the film pressure of the high-viscosity material 1. That is, the controller C switches the first step of driving the mold 6 at the first speed as a high speed to the second step, such that the step (second step) of driving the mold 6 at the second speed as a low speed includes the timing at which the pattern surface comes in contact with the film of the high-viscosity material 1.

Figure 7:
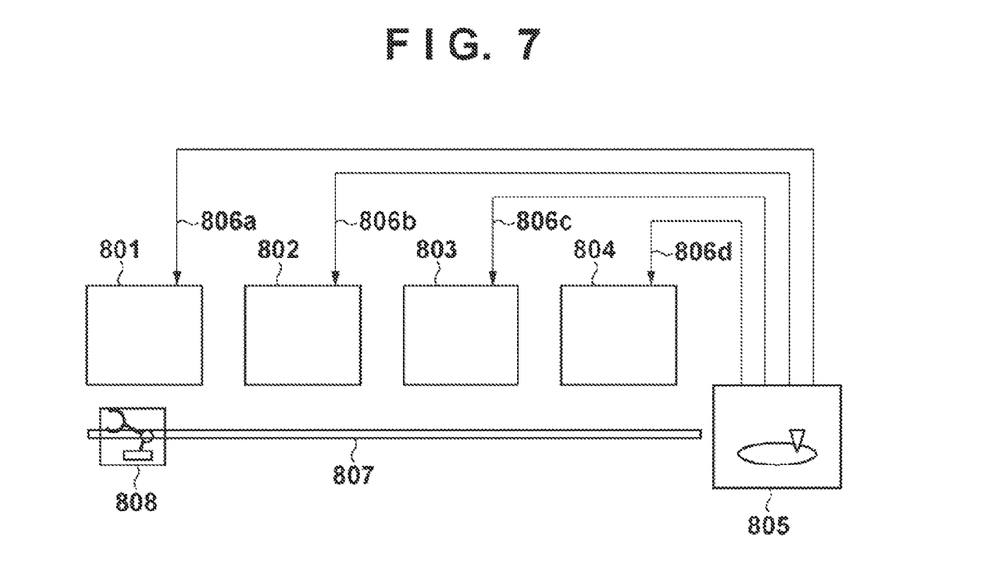
FIG. 7 is a view showing a system including imprint apparatuses.

FIG. 7 shows an arrangement example of a plurality of imprint systems to which the present invention is applicable. A plurality of imprint apparatuses 801 to 804 execute imprint processing based on the JFIL method. A foreign substance inspection apparatus 805 inspects the presence/absence of the foreign substance 4 on the wafer 7 before the wafer 7 is transported to the imprint apparatuses 801 to 804. The foreign substance inspection apparatus 805 inspects the presence/absence of the foreign substance 4 having a size of, for example, about 10 to 0.1 μm, on the surface of the wafer 7 having no patterns formed on it, or on the surface of the wafer 7 having alignment marks and circuit patterns formed on it. If the foreign substance 4 is detected, pieces of information concerning an identification ID of the wafer 7 and the position, size, and properties of the foreign substance 4 are recorded. These pieces of information are transmitted as additional information of the wafer 7 to be imprinted, to the imprint apparatuses 801 to 804 via communication paths 806a to 806d, respectively. On the other hand, a transporting mechanism 808 loads the inspected wafer 7 into each of the imprint apparatuses 801 to 804 via a transporting path 807. The foreign substance inspection apparatus 805 may also be incorporated into each of the imprint apparatuses 801 to 804. When the foreign substance inspection apparatus 805 is incorporated, the foreign substance 4 can be detected even if it adheres on the wafer 7 in an interval during which the wafer 7 is transported to each of the imprint apparatuses 801 to 804. On the other hand, if the risk of adhesion of the foreign substance 4 is low, or if the processability of the foreign substance inspection apparatus 805 is high, the efficiency is increased by separating the foreign substance inspection apparatus 805 from the imprint apparatuses 801 to 804 as shown in FIG. 7.

The imprint apparatus will be explained below with reference to FIGS. 8A and 8B. The mold 6 as an original is held with its pattern surface facing down on the mold chuck 14 on the mold stage suspended from a structure 10 and movable in the Z direction and leveling directions (ωx, ωy). The wafer 7 is held with its transfer target surface facing up on a wafer chuck on a wafer stage (substrate stage) 13 drivable in the X, Y, and θ directions. In the imprint sequence, the mold 6 held by the mold chuck 14 moves down. A dispenser (first coating device) 15 for coating the wafer 7 with a resin is a module including a plurality of micro jet nozzles arranged in one direction like a nozzle arrangement used in an inkjet printer. In a step of dispensing the resin 5 by the JFIL method, immediately before imprinting, the shot region 3 on the wafer 7 is scanned immediately below the dispenser 15 in a direction perpendicular to the nozzle array, thereby coating the shot region 3 with the resin 5. The syringe 2 coats the shot region 3 with the high-viscosity material 1 as a resin that covers the foreign substance 4. Since the mechanism for applying the high-viscosity material 1 is different from the dispenser 15 for dispensing the resin 5, the high-viscosity materials 1 having different compositions can be selected. In addition, since the viscosity is high and the coating area is small, the high-viscosity material 1 is dispensed by using a single syringe type nozzle instead of an inkjet type nozzle having a small grain size. It is also possible to mount the syringe 2 on the wafer stage 13, dispense the high-viscosity material 1 to a portion of the mold 6 which corresponds to the portion contaminated by the foreign substance 4 on the wafer 7, and transfer the high-viscosity material 1 dispensed on the mold 6 to the portion contaminated by the foreign substance 4 on the wafer 7. The alignment scope 9 is used to measure the die-by-die alignment marks 601, and movable in the X and Y directions in accordance with the view angle of the shot region 3. An ultraviolet light source 11 generates ultraviolet light for curing the resin 5 after it is filled, and refracts the ultraviolet light by a mirror 12, thereby irradiating the resin 5 from the non-pattern surface of the mold 6. FIG. 8B is a view showing the imprint apparatus from a surface A shown in FIG. 8A. A mesa surface 8 rising toward the wafer 7 by a few 10 μm from the mold outer frame surface is formed on the mold 6, and patterns and the alignment marks 601 are formed on the mesa surface 8. There are no important limitations on the positions of the syringe 2 and dispenser 15, provided that they do not interfere with the mold chuck 14.

Figure 11:
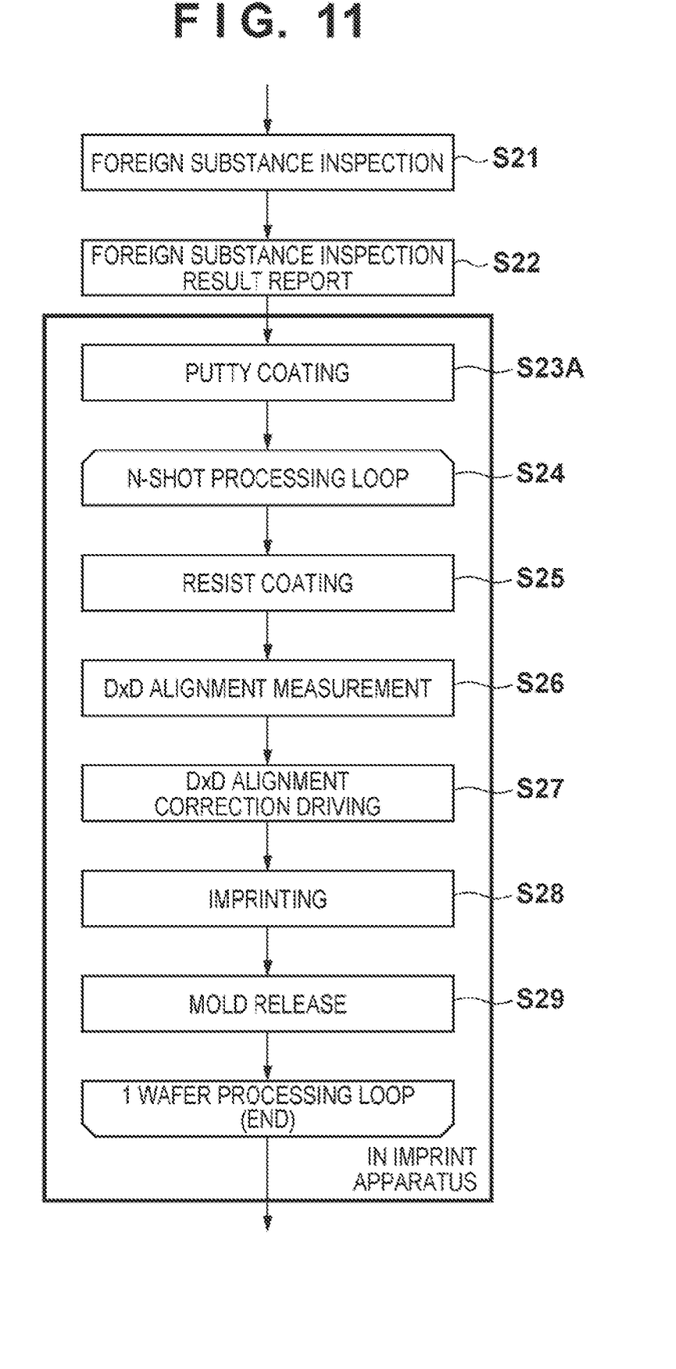
FIG. 11 is a view showing the procedure of an imprint method using the JFIL method.

FIG. 11 shows an example of the film formation and imprint sequence using the JFIL method.

The foreign substance inspection apparatus 805 performs foreign substance inspection on the wafer 7 (step S21), and reports the result to the controller C of the imprint apparatus (step S22). In step S23A, the controller C causes the syringe 2 to drop the high-viscosity material 1 in the detected position of the foreign substance 4 on the wafer 7. From step S24, a typical imprinting process based on JFIL is performed. In step S25, the controller C causes the dispenser 15 to coat the wafer 7 with the light-curing resin 5 that is a normal resist. In step S26, the controller C causes the alignment scope 9 to perform die-by-die measurement of the relative distance relationship between the substrate-side marks 601 and mold-side marks (not shown), and corrects the target value of the wafer stage 13 so that a displacement amount obtained as the measurement result has a predetermined value. In step S28, the controller C performs an imprint operation and exposure operation. In step S29, the controller C pulls up the mold 6 to release it from the resin 5 cured by ultraviolet light. The steps from step S25 to step S29 described above are repeated by the number of shot regions arranged on the wafer 7.

[Second Embodiment]

Figure 3:
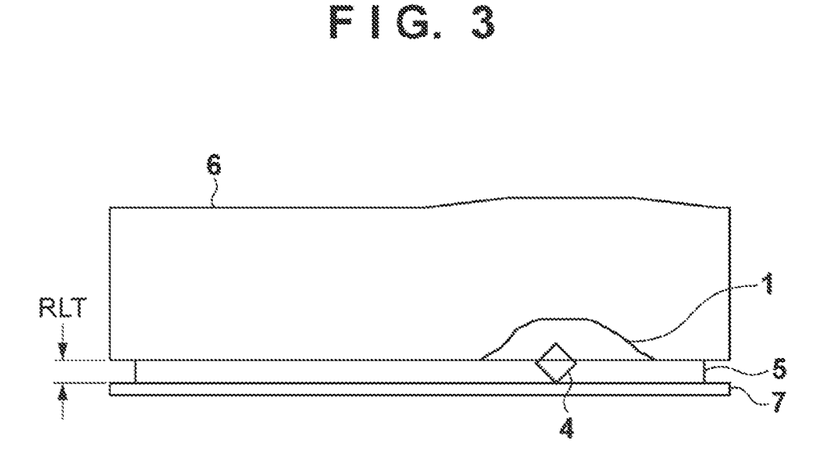
FIG. 3 is a view showing the way a film covering a foreign substance is formed in the second embodiment.
Figure 12:
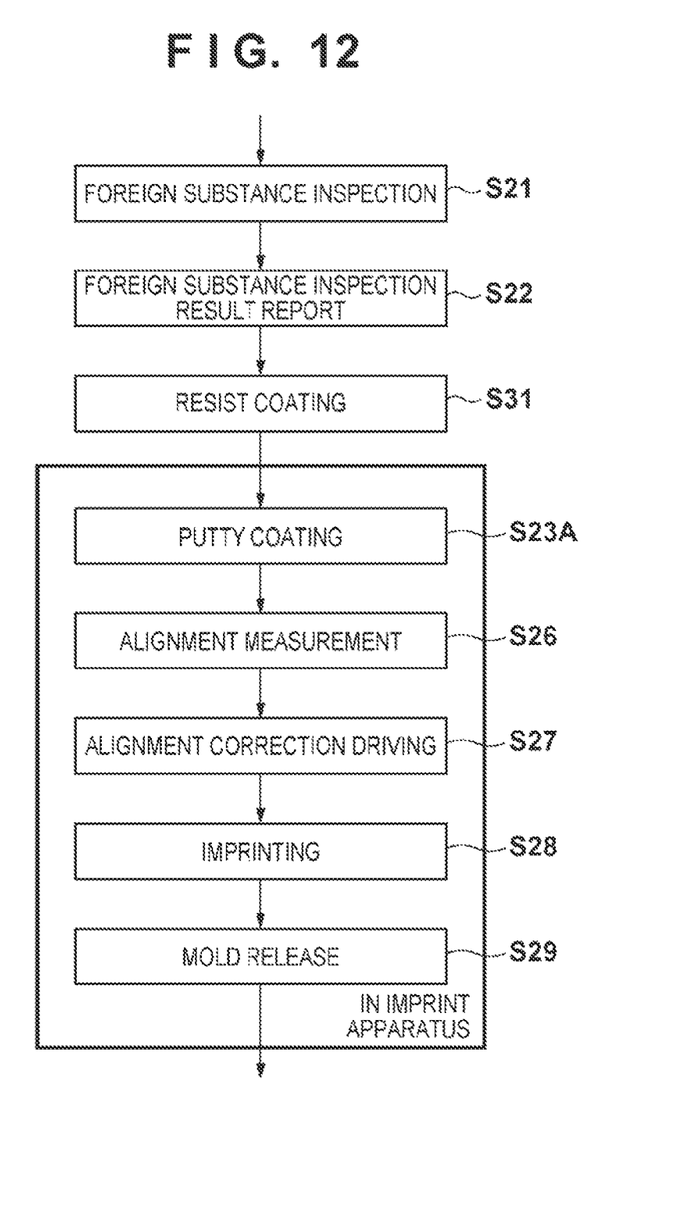
FIG. 12 is a view showing the procedure of an imprint method in a method of dispensing a resin at once outside an apparatus.

FIG. 3 shows the second embodiment in which a film for protecting a mold is formed on a wafer 7 by using an imprint method of dispensing a resin 5 by using a coater or the like outside an imprint apparatus. In this case, the imprint apparatus includes no dispenser 15 for dispensing a normal resin. In the second embodiment, a syringe 2 installed in the imprint apparatus to dispense a high-viscosity material 1 forms the film based on an inspection result from a foreign substance inspection apparatus 805. Although the syringe 2 need not always be installed in the imprint apparatus, it is realistic to install the syringe 2 in the imprint apparatus including an alignment mechanism because a function of specifying a location on the wafer 7 is necessary. In this method, as shown in FIG. 3, the high-viscosity material 1 is dispensed on the resin 5 dispensed beforehand outside. FIG. 12 shows wafer processing in the second embodiment. The foreign substance inspection apparatus 805 outside the imprint apparatus performs foreign substance inspection on the wafer 7 (step S21), and reports the result to the imprint apparatus (step S22). In step S31, the resin 5 is dispensed by a coater outside the imprint apparatus and loaded into the imprint apparatus. In step S23A, a controller C of the imprint apparatus dispenses the material 1 on the wafer 7 loaded into the imprint apparatus. After that, an imprint processing loop is repeated for each shot region 3, and the controller C performs die-by-die alignment measurement in step S26 and alignment correction driving in step S27. Then, the controller C repeats an imprint operation (including imprinting and light irradiation) in step S28 and a release operation in step S29 by the number of shot regions 3. Also, a method of writing and imprinting transfer patterns of one wafer 7 has been proposed. In this method, the imprint processing loop after the high-viscosity material 1 is dispensed is replaced with simultaneous wafer imprint processing.

[Third Embodiment]

Figure 9:
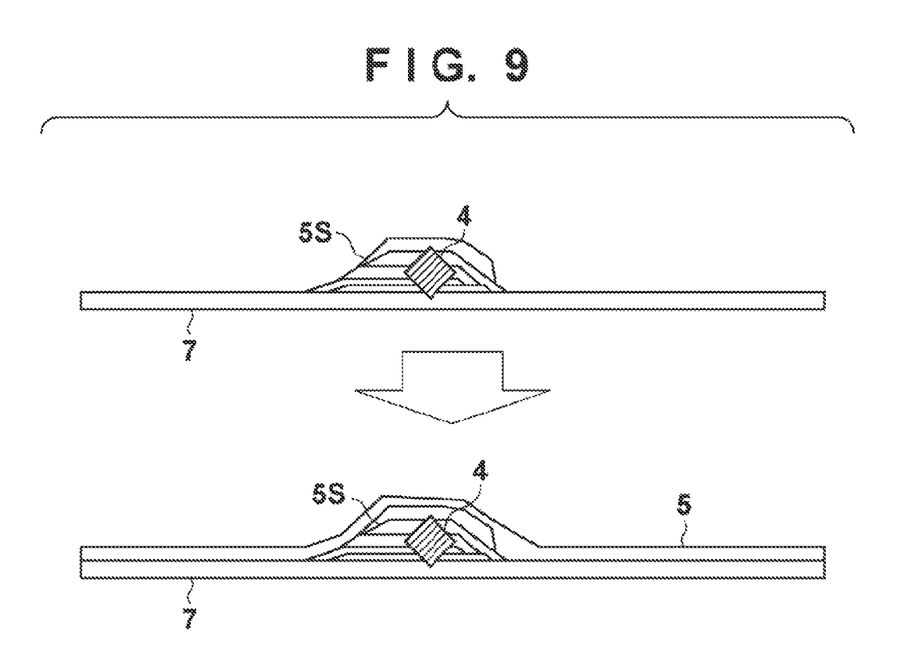
FIG. 9 is a view showing the way a film covering a foreign substance is formed in the third embodiment.
Figure 13:
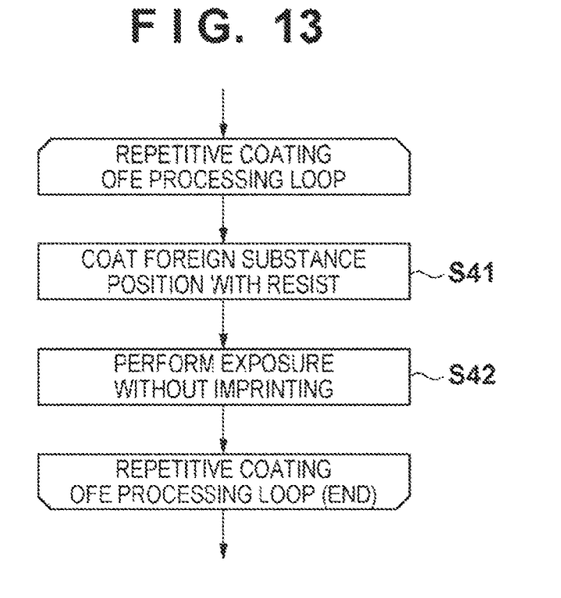
FIG. 13 is a view showing a procedure of forming a layer covering a foreign substance by jetting molding.

FIG. 9 shows the way a film for protecting a mold is formed in the third embodiment. In the third embodiment, a high-viscosity material 1 for forming the film is the same material as a resin 5, so there is no coating mechanism for the high-viscosity material 1. If a foreign substance inspection apparatus 805 detects a foreign substance 4, a controller C drops the normal resin 5 on the foreign substance portion in step S41, following the procedure of a repetitive coating process shown in FIG. 13. In step S42, the controller C simply cures the resin 5 by ultraviolet irradiation without imprinting a mold 6. This step of curing the resin 5 by ultraviolet irradiation without imprinting the mold 6 will be called open frame exposure (OFE). The controller C performs steps S41 and S42 once or a plurality of number of times, thereby forming a film 5S made of the cured material of the resin 5. After that, the controller C dispenses the normal resin 5 from a dispenser in the same manner as that for other shot regions, thereby performing an imprint operation. The method of the third embodiment is effective when the viscosity of the normal resin 5 is too low and no expected resin rising portion can be formed in the imprint operation even if the dispensing amount of the resin 5 is increased.

[Fourth Embodiment]

Figure 10:
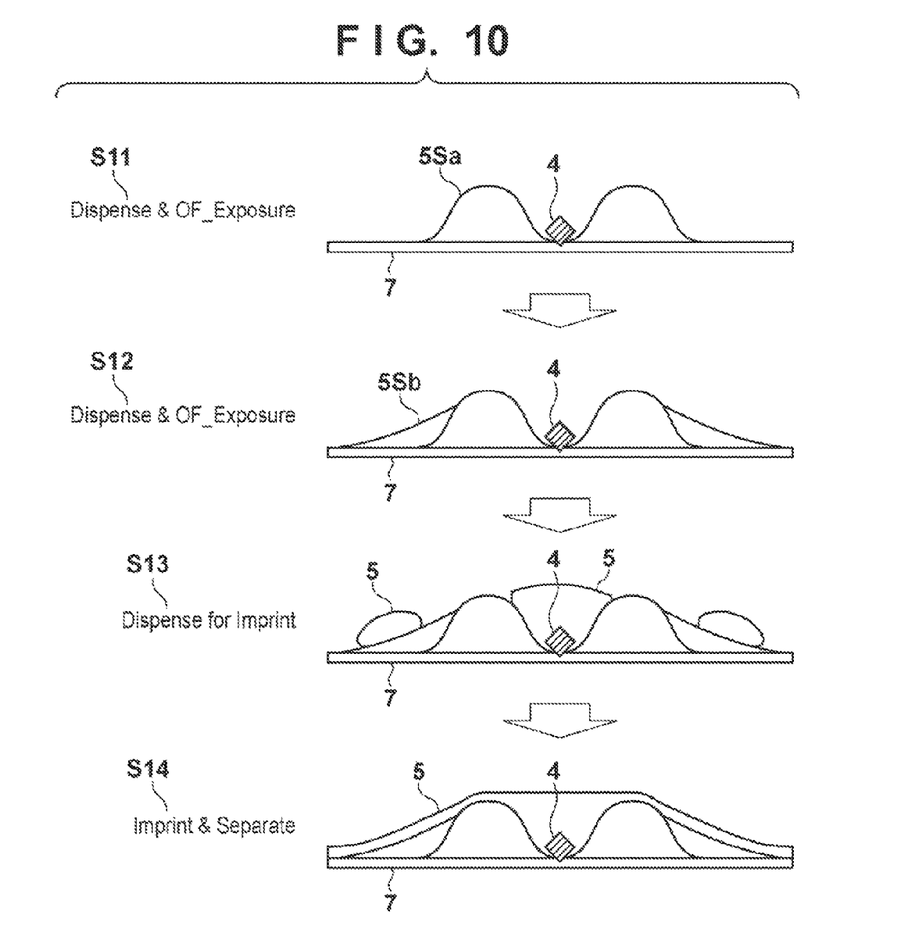
FIG. 10 is a view showing the way a film covering a foreign substance is formed in the fourth embodiment.

FIG. 10 shows the way a film for protecting a mold is formed in the fourth embodiment. That is, the fourth embodiment uses both the formation of a film by open frame exposure shown in FIG. 9, and the formation of a film by using a number of drops of a high-viscosity material 1 explained with reference to FIG. 4. In step S11, a controller C drops the high-viscosity material 1 around a foreign substance 4, and cures the high-viscosity material 1 by open frame exposure (5Sa). In step S12, the controller C forms a thinner film around the high-viscosity material 1 in order to eliminate a steep step on the surface of a wafer 7 (5Sb). In addition, the controller C drops a normal resin 5 in step S13, and performs an imprint operation in step S14. As the resin for forming the film, a resin having the same composition as that of the normal resin 5 may also be used in accordance with the third embodiment.

Each method explained above can perform imprint processing using the mold 6 within the designed range even when the foreign substance 4 adheres to the wafer 7, and manufactures good chips from the chip regions 602 not contaminated by the foreign substance in the shot region 3. In the present invention, it is only necessary to add the step of dropping the high-viscosity material 1, which is complete within a short time period, so the productivity is not significantly decreased by, for example, replacement of the mold 6.

[Article Manufacturing Method]

A method of manufacturing devices (for example, a semiconductor integrated circuit device and liquid crystal display device) as articles includes a step of transferring (forming) patterns onto a substrate (wafer, glass plate, or film-like substrate) by using the above-described imprint apparatus. This manufacturing method can further include a step of etching the substrate on which the patterns are transferred. Note that when manufacturing another article such as a patterned medium (recording medium) or optical element, the manufacturing method can include another step of processing the substrate on which the patterns are transferred, instead of the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-134453 filed Jun. 16, 2011, which is hereby incorporated by reference herein in its entirety.

What is claimed is:

1. An imprint method comprising a dispensing step of dispensing a resin on a substrate on which a plurality of chip regions are formed, using a first coating device, a contact step of bringing the dispensed resin into contact with a mold, and a curing step of curing the resin in contact with the mold, the method further comprising:
    an inspection step of inspecting the substrate to obtain information on a foreign substance which exists on the substrate; and a film forming step of forming a film covering the foreign substance by dispensing, using a second coating device different from the first coating device, a material different from the resin onto or around the foreign substance only in a chip region on the substrate where the foreign substance exists based on the information on the foreign substance obtained in the inspection step,
    wherein, in the dispensing step, the resin, which is brought into contact with the mold, is dispensed in the chip regions on the substrate, where the foreign substance does not exist, by dispensing the resin directly onto the substrate.

2. The method according to claim 1, wherein the information includes at least one of a position of the foreign substance and a size of the foreign substance.

3. The method according to claim 1, wherein the film forming step is performed before the dispensing step.

4. The method according to claim 3, wherein the film forming step comprises a step of dispensing a material on the substrate covering the foreign substance, and a step of curing the dispensed material without bringing the material into contact with the mold.

5. The method according to claim 1, wherein a material covering the foreign substance has a viscosity higher than that of the resin.

6. The method according to claim 5, wherein the dispensing device which dispenses the material comprises a syringe.

7. The method according to claim 1, wherein in the contact step, the resin and the mold are brought into contact with each other while positioning the substrate so as to reduce displacement between the mold and the substrate, which occurs in a direction parallel to a surface of the mold due to the formation of the film.

8. The method according to claim 1, wherein in the contact step, the resin and the mold are brought into contact with each other while positioning the substrate in a direction parallel to a surface of the mold based on a detection result of displacement between a substrate-side mark formed on the substrate, whose distance to the foreign substance has not less than a predetermined value, and a mold-side mark formed on the mold corresponding to the substrate-side mark.

9. The method according to claim 1, wherein the contact step includes a first step of driving the mold at a first speed along a direction perpendicular to a surface of the mold, and a second step of driving the mold at a second speed lower than the first speed, and, when the film is formed, the first step and the second step are switched such that the second step includes a timing at which the mold contacts the film.

10. An article manufacturing method comprising:
a step of forming a pattern on a substrate by using an imprint method including a dispensing step of dispensing a resin on a substrate on which a plurality of chip regions are formed, using a first coating device, a contact step of bringing the dispensed resin into contact with a mold on which a plurality of chip regions are formed, and a curing step of curing the resin in contact with the mold; and
a step of processing the substrate on which the pattern is formed in the preceding step,
the imprint method further including:
an inspection step of inspecting the substrate to obtain information including a position of a foreign substance which exists on the substrate; and a film forming step of forming a film covering the foreign substance by dispensing, using a second coating device different from the first coating device, a material different from the resin onto or around the foreign substance, only in a chip region on the substrate, where the foreign substance exists, based on the information on the foreign substance obtained in the inspection step, wherein, in the dispensing step, the resin, which is brought into contact with the mold, is dispensed in the chip regions on the substrate, where the foreign substance does not exist, by dispensing the resin directly onto the substrate.

11. The method according to claim 1, in the contact step, the dispensed resin is brought into contact with the pattern surface of the mold while the material different from the resin is dispensed in the chip regions on the substrate, where the foreign substance exists, and the resin, which is brought into contact with the pattern surface of the mold, is dispensed in the chip regions on the substrate, where the foreign substance does not exist.

* * * * *